United States Patent [19]
Clinton et al.

[11] Patent Number: 5,898,623
[45] Date of Patent: Apr. 27, 1999

[54] INPUT PORT SWITCHING PROTOCOL FOR A RANDOM ACCESS MEMORY

[75] Inventors: Michael Patrick Clinton, Essex Junction; Timothy Jay Dell, Colchester; Erik Leigh Hedberg; Mark William Kellogg, both of Essex Junction; Wilbur David Pricer, Charlotte, all of Vt.

[73] Assignee: International Business Machines Corporation, Armonk, N.Y.

[21] Appl. No.: 08/947,762

[22] Filed: Oct. 9, 1997

[51] Int. Cl.⁶ .................................................. G11C 16/04
[52] U.S. Cl. .............................. 365/189.04; 365/189.02; 365/230.02; 365/230.03
[58] Field of Search .................... 365/189.02, 189.04, 365/149, 230.05, 230.02, 230.03

[56] References Cited

U.S. PATENT DOCUMENTS

| | | | |
|---|---|---|---|
| 4,882,709 | 11/1989 | Wyland | 365/189.02 |
| 5,511,024 | 4/1996 | Ware et al. | 365/189.04 |
| 5,642,387 | 6/1997 | Fukasawa | 365/189.04 X |
| 5,768,211 | 6/1998 | Jones et al. | 365/230.05 |

Primary Examiner—Huan Hoang
Attorney, Agent, or Firm—Whitham, Curtis & Whitham; Robert A. Walsh

[57] ABSTRACT

A high speed/narrow I/O DRAM device comprises both a data input/output (I/O) port as well as a command port for receiving commands used to control the operations of the DRAM. The command port is defined as input only (i.e., for inputting command data). The present invention comprises multiplexing write data to be written and stored in the DRAM onto the command port with command data packets. The data I/O port can then become dedicated to streaming out seamless data since it no longer needs to flip between input and output data. Even greater bus efficiency can be realized if, during a command packet transfer, data writes to the DRAM are switched back to the data I/O port. With this input port switching protocol, greater bus efficiency and increased memory performance can be realized.

13 Claims, 4 Drawing Sheets

INPUT PORT SWITCHING PROTOCOL FOR A RANDOM ACCESS MEMORY

BACKGROUND OF THE INVENTION

1. Field of the Invention

The present invention generally relates to high bandwidth/performance Dynamic Random Access Memories (DRAMs) and, more particularly, to high bandwidth/performance DRAMs with improved command bus utilization for increased data input/output (I/O) capabilities.

2. Description of the Related Art

Dynamic random access memory (DRAM) performance is a well known limitation to computer system performance. Processor speeds are rapidly outpacing main memory performance, with both processor designers and system manufacturers developing higher performance memory subsystems in an effort to minimize performance limitations due to the slower DRAM devices. Ideally, the memory performance would match or exceed processor performance, i.e., a memory cycle time would be less than one processor clock cycle. This is almost never the case and, so, the memory is a system bottleneck. For example, a state of the art high speed microprocessor may be based on a 200 MegaHertz (MHZ) clock with a 5 nanosecond (ns) clock period. A high performance DRAM may have a 60 ns access time, which falls far short of processor performance.

This system bottleneck is exacerbated by the rise in popularity of multimedia applications. Multimedia applications demand several times more bandwidth for main memory or frame-buffer memory than computational intensive tasks such as spread sheet analysis programs or, other input/output (I/O) intensive applications such as word processing or printing.

Extended Data Out (EDO) and Synchronous DRAMs (SDRAMs) were developed to improve bandwidth. However, SDRAMs and EDO RAMs still do not match processor performance and, therefore, still limit system performance. Consequently, as faster microprocessors are developed for multimedia processing and high performance systems, faster memory architecture is being developed to bridge the memory/processor performance gap, e.g., wide I/O DRAMs.

Recent developments predict a major turning point for memory devices and related subsystems with a shift to high speed/narrow I/O devices. Recent developments in high bandwidth memory I/O design have shown performance advantages by separating memory command inputs from data I/O. This re-allocation of pin definition has increased the required memory function pins, but it has also permitted continuous data flow for high bandwidth memory. However, this re-allocation has also created a bus utilization inefficiency between command ports and data ports. While the data ports are continuously flipping direction to satisfy reading or writing of data, the command ports become active only when a new command packet must be received. This creates a bus efficiency imbalance which can impede performance and data rate potentials.

SUMMARY OF THE INVENTION

It is therefore an object of the present invention to provide a memory device which utilizes its command port to also receive write data between commands;

It is yet another object of the present invention to provide a DRAM device which can multiplex write data on the command port between command packets to free input/output (I/O) ports for output data.

According to the present invention, a high speed/narrow I/O DRAM device comprises both a data input/output (I/O) port as well as a command port for receiving commands and addresses used to control the operations of the DRAM. The command port is defined as input only (i.e., for inputting command data). The present invention comprises switching write data to be written and stored in the DRAM onto the command port which is programmable to receive command data packets multiplexed with write data. The data I/O port can then become dedicated to streaming out seamless data since it no longer needs to flip between input and output states.

Even greater bus efficiency can be realized if, during a command packet transfer, data writes to the array are switched back to the data I/O ports. By allowing high bandwidth memory to employ this data-in port switching protocol, greater bus efficiency and increased memory performance can be realized.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
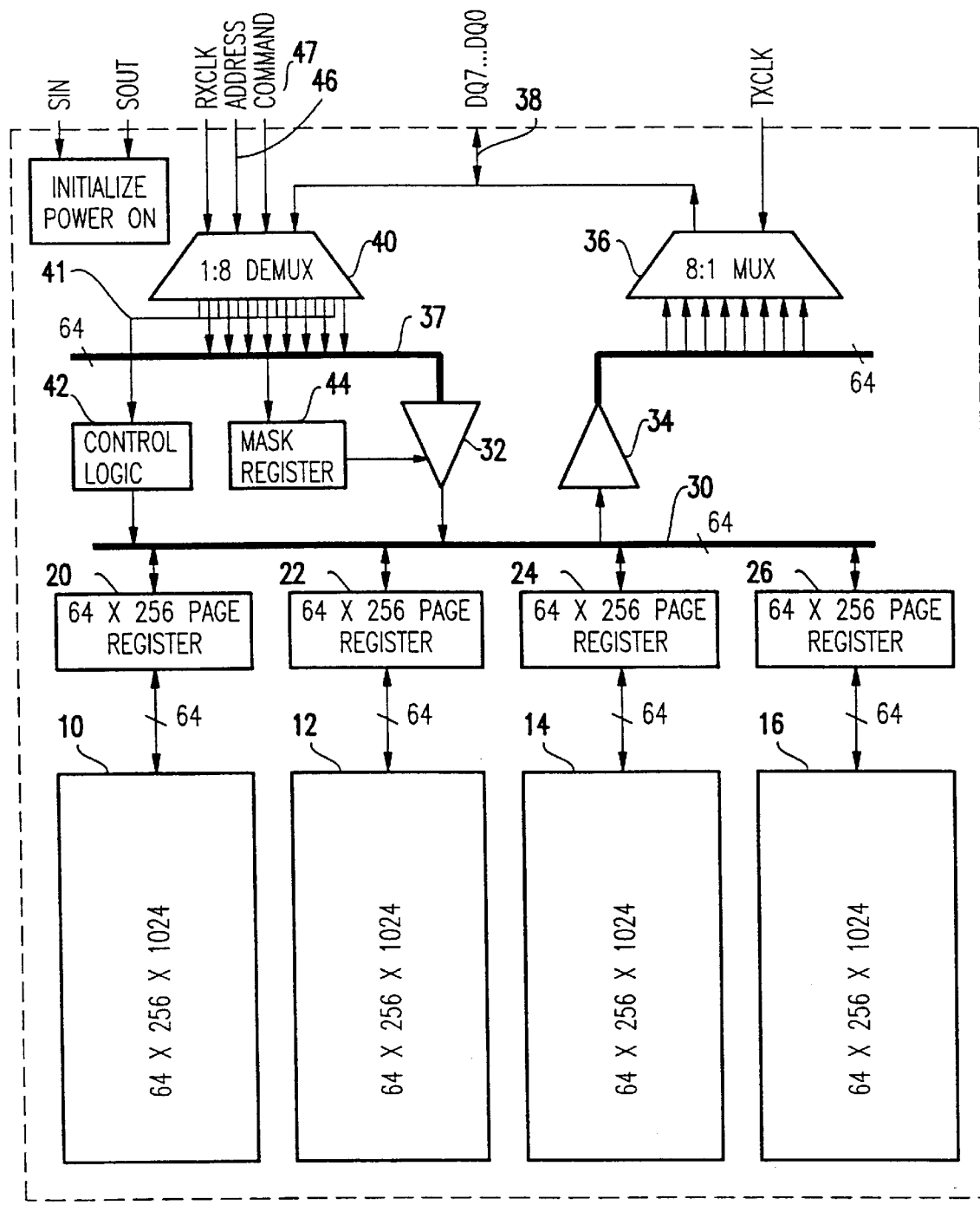
FIG. 1 is block diagram of a related high speed I/O DRAM memory page register device comprising addressable DRAM memory banks.

Referring now to the drawings, and more particularly to FIG. 1, there is shown a related high speed I/O DRAM memory device of the type sought to be improved by the present invention. A 16 Mb memory array comprises four 4 Mb (64×256×1024) sub-arrays 10, 12, 14, and 16. Each of the sub-arrays are buffered by a page register 20, 22, 24, and 26, respectively. The page registers are organized as 64×256 bit addresses (i.e., 2 Kb). Data to and from the page registers 20, 22, 24, and 26 are transferred on a sixty-four bit bus 30 from driver 32 or buffer 34. Buffer 34 passes data from the sixty-four bit bus 30 to an 8:1 multiplexer (MUX) 36 and, in turn, the multiplexer 36 passes the data off chip to I/O pins 38 DQ0–DQ7. The sixty-four bit bus 30 permits eight bursts of eight bits. Similarly, data in from the I/O pins 38 are received by a 1:8 demultiplexer (DEMUX) 40 which, under the control of control logic 42 and data mask register 44, is passed over bus 37 and the driver 32 to the sixty-four bit-bus 30.

In the device shown in FIG. 1, access addresses and commands are piped into the control logic 42 via the address and command inputs 46 and 47. The first command packet, subsequent addresses, and commands are serially scanned into the address pin 46 and command pin 47 during data transfers. Control logic 42 is carried on bus 41 from demux 40. Both read and write data is carried by the I/O port 38. Hence, the I/O port 38 constantly flips directions depending on whether data is being input or output.

Figure 2:
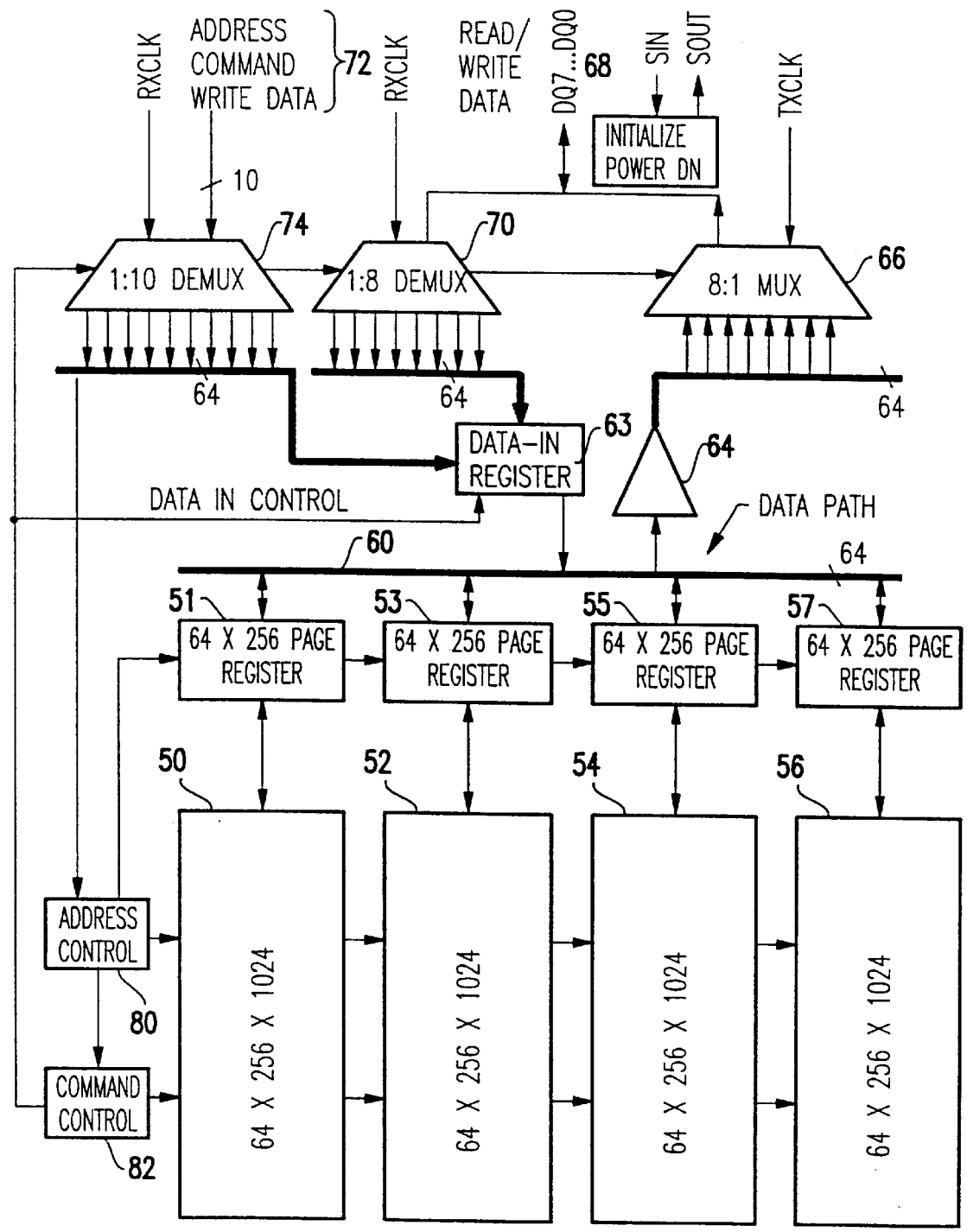
FIG. 2 is block diagram of the DRAM device according to the present invention.

Referring now to FIG. 2, there is shown a memory device according to the present invention. As above, a 16 Mb memory array comprises four 4 Mb (64×256×1024) sub-arrays 50, 52, 54, and 56. Each of the sub-arrays are buffered by a page register 51, 53, 55, and 57, respectively. However, it is understood that although the present invention is described in terms a 64 Mb memory banks, the organization and density are for example only and not intended to limit the invention to only those densities described.

The page registers are organized as 64×256 bit addresses (i.e., 2 Kb). Data to and from the page registers 51, 53, 55, and 57 are transferred on a sixty-four bit bus 60 from driver the data-in register 63 or buffer 64. Buffer 64 passes data from the sixty-four bit bus 60 to an 8:1 multiplexer (MUX) 66 and, in turn, the multiplexer 66 passes the data off chip via I/O port 68 comprising pins DQ0–DQ7. The sixty-four bit bus 60 permits eight bursts of eight bits. Similarly, data in from the I/O pins 68 are received by a 1:8 demultiplexer (DEMUX) 70 which, is passed by the data in register 63 to the sixty-four bit-bus 60. In addition, an additional demultiplexer (DEMUX) 74 is programmable to receive command data as well as write data multiplexed with command data whenever the I/O port 68 is busy with read data. In this example, the additional DEMUX 74 is a 1:10 DEMUX, where write date comprises 8-bits and the remaining 2-bits are used by control and address data which are each 1-bit. A data-in register 63, which can store up to one page of write data, temporally holds write data received from the address/command port 72 whenever bus 60 is engaged in a read operation.

For example, in a write operation, data-in to be written to the sub-arrays 50, 52, 54, and 56 may be input to I/O ports 68 through a demultiplexer 70 and register 63. However, according to the present invention, write data can alternatively be input via the command ports 72 through the additional demultiplexer 74. In this case, the data-in register 63 temporarily stores the incoming data. Control and address data is also input via the command port 72 and multiplexed on 2-bits with the write data packets. Address and control data is routed to an address control register 80 and command control 82, respectively, to control the sub-arrays 50, 52, 54, and 56. In addition, the command control 82 may be used to control the programmable address/command port 74 to also accept write data multiplexed with address/command data. Hence, with the present invention data I/O ports 68 can become dedicated to streaming out seamless data since they no longer need to flip between input and output states. Once a page of data is read out, the page of write data stored in the data-in register 63 can be written to the subarrays 50, 52, 54, and 56. This makes for a very efficient use of bus 60.

In addition, even greater bus efficiency can be realized if, during a command data packet transfer, data writes are switched back to the data I/O ports 68 when no read is in progress. By allowing high bandwidth memory to employ this data-in port switching protocol, greater bus efficiency and increased memory performance can be realized.

Figure 3:
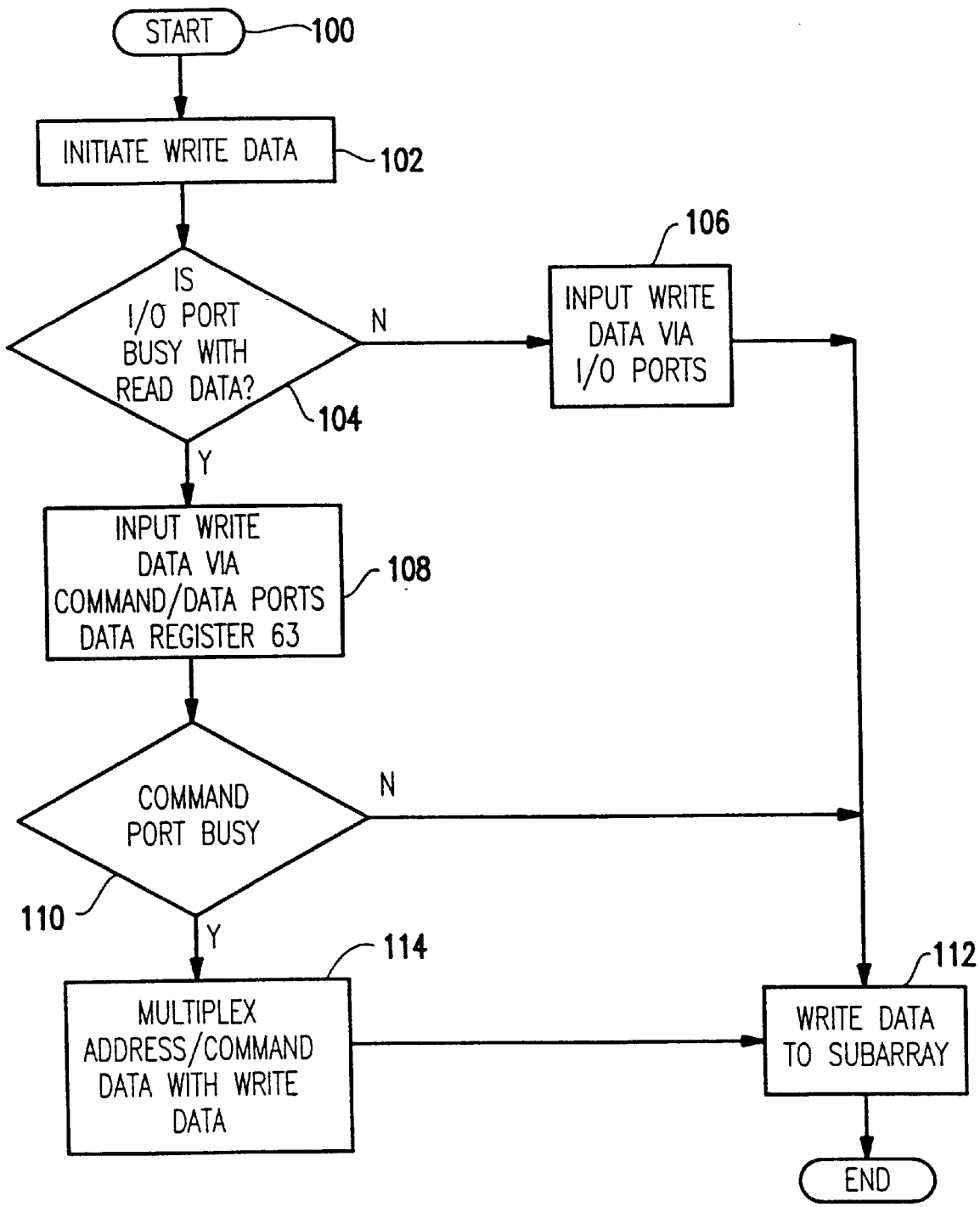
FIG. 3 is a flow diagram for a data read/write operation for the circuit shown in FIG. 2.

Referring now to FIG. 3, there is shown a flow diagram illustrating the a data read/write operation according to the present invention. Starting with block 100, a data write operation is initiated at block 102. If the data I/O port 68 is not busy outputting read data at block 104, then write data is input via the I/O port 68 at block 106. If however, the I/O port 68 is busy outputting read data, then the write data is input via the command port 72, at block 108. If the command port 72 is not busy with command data at decision block 110, then the write data presented to the command port 72 is written to the subarrays 50, 52, 54, and 56, at block 112. If, on the other hand, the command port 72 is busy inputting command data, then the write data is multiplexed with packets of command data at block 114. Thereafter, the write data is written to the subarrays at block 112.

Figure 4A:
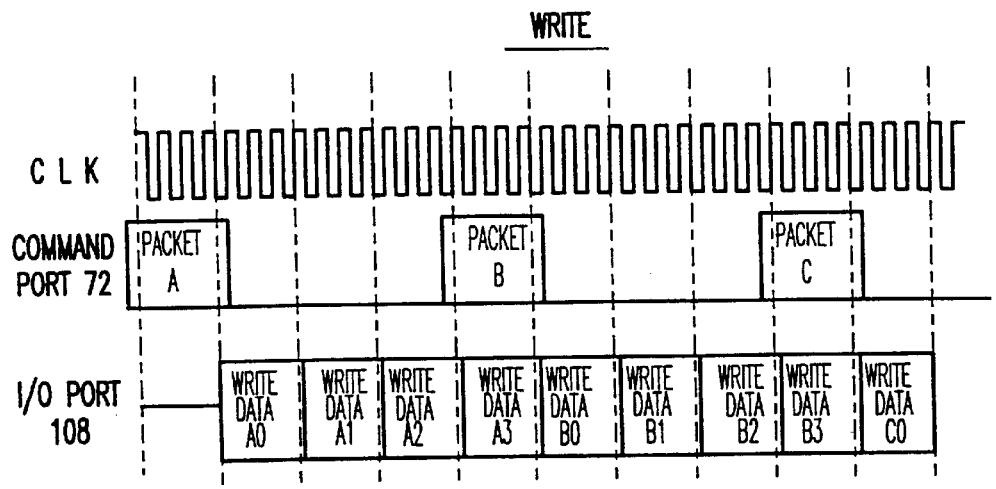
FIGS. 4A–4C are timing diagrams showing a write operation, a read operation, and a simultaneous read and write operation, respectively.
Figure 4B:
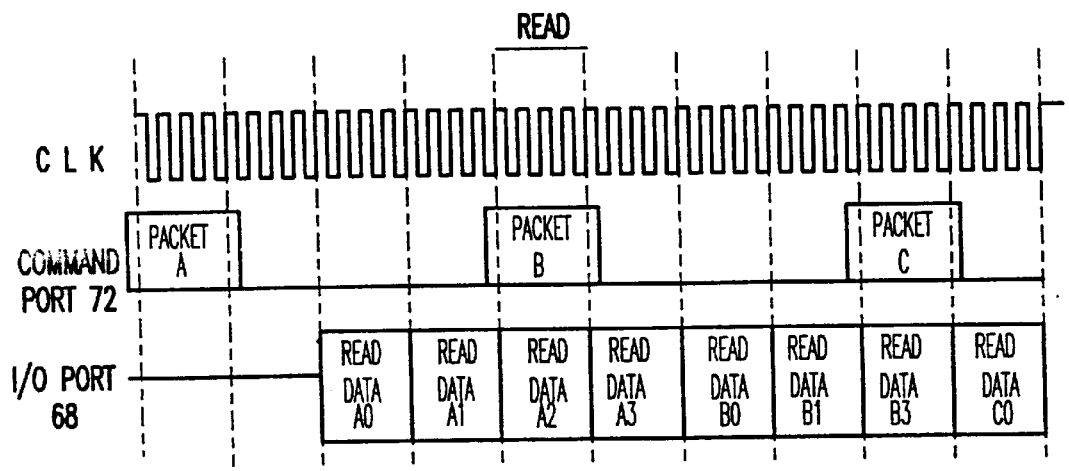
Figure 4C:
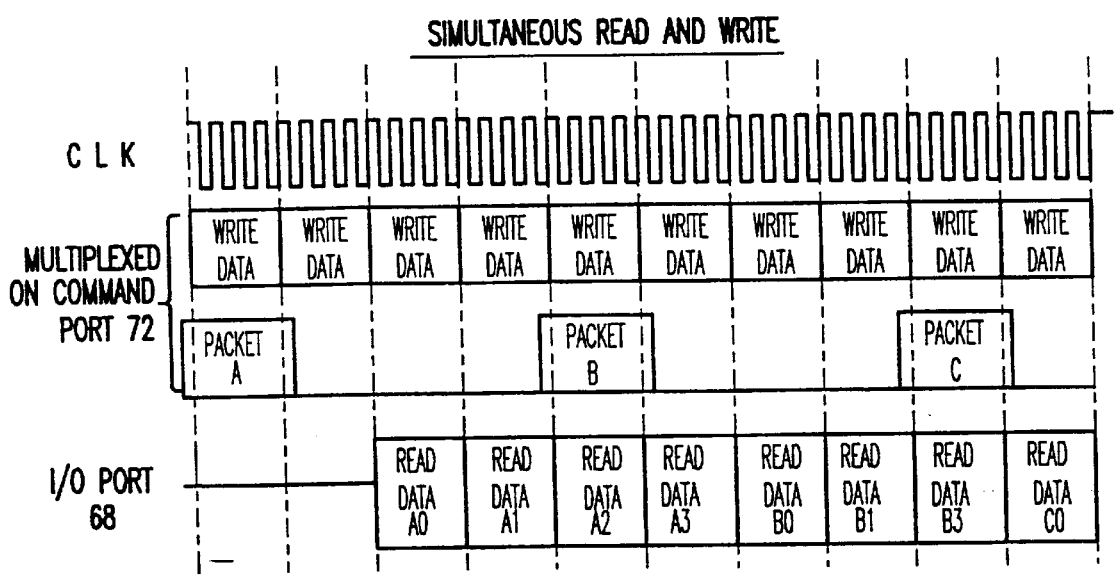

Referring now to FIG. 4A–4C, timing diagrams showing a write operation, a read operation, and a simultaneous read and write operation, respectively. The write and read operations are fairly straightforward. In a write operation, addresses and control data (command packets A, B, and C) are input via the command port 72 as shown in FIG. 2. Write data packets are input via the I/O port 68. Likewise, in a read operation, the address and control data (command packets A, B, and C) may still be input via the command port 72 and the read data is output via the I/O port 68. The first empty time slot of the read data is caused by latency due to array access time. In both of these cases, the I/O port 68 may be used to read or write data (i.e., one or the other)in a traditional manner. If a write operation were to be requested during a read operation, either the write operation would have to be delayed until the read was completed or the write operation would have to interrupt the read operation to use the I/O port 68 and bus 60.

Referring to FIG. 4C a timing diagram for a simultaneous read and write operation is shown. According to the invention, the data ports 68 and 72 are programmable for switching write data between the conventional I/O port 68 and the command port 72 during a simultaneous read and write operation. In this case, the address and command packets (packets A, B, and C) are still input via the command port 72 and the read data is output via the I/O port 68. However, read and write operations may be carried out simultaneously since the read data is output via the I/O port 68. Simultaneously, write data is input via the command port 72 multiplexed with the address and control data. Hence, the data I/O port 68 can then become dedicated to streaming out seamless data since it no longer needs to flip between input and output states.

While the invention has been described in terms of a single preferred embodiment, those skilled in the art will recognize that the invention can be practiced with modification within the spirit and scope of the appended claims.

We claim:

1. A random access memory (RAM) device, comprising:

a data input/output port; and a programmable command port, wherein write data to be written to said random access memory is input to one of said data input/output port and said programmable command port, wherein write data input to said programmable command port is multiplexed in a serial stream with command data and address data used to control and address said random access memory allowing said data input/output port to be dedicated to outputting read data from said random access memory.

2. A random access memory (RAM) device comprising:

a data input/output port;

a programmable command port, wherein write data to be written to said random access memory is input to one of said data input/output port and said programmable command port, wherein write data input to said programmable command port is multiplexed with command data used to control said random access memory allowing said data input/output port to be dedicated to outputting read data from said random access memory; and a data-in register for holding write data from said programmable command port while said data input/output port is outputting read data.

3. A random access memory (RAM) device comprising:

a data input/output port; and a programmable command port, wherein write data to be written to said random access memory is input to one of said data input/output port and said programmable command port, wherein write data input to said programmable command port is multiplexed with command data used to control said random access memory allowing said data input/output port to be dedicated to outputting read data from said random access memory, wherein said programmable command port comprises a demultiplexer for demultiplexing said write data and said command data.

4. A random access memory (RAM) device as recited in claim 3 wherein said demultiplexer further demultiplexes command data to control data and address data.

5. A random access memory (RAM) device controller having a simultaneous read and write mode, comprising:

an input/output port;

a multiplexer connected to said input/output port for providing read data from said random access memory;

a first demultiplexer connected to said input/output port for providing write data to said random access memory;

a programmable input port;

a second demultiplexer connected to said programmable input port; and a register connected to said first demultiplexer and said second demultiplexer for buffering write data, wherein in a write mode said programmable input port receives command data for controlling said random access memory and said input/output port receives write data to be written to said random access memory, and in a simultaneous read and write mode said programmable input port receives said command data multiplexed with said write data, and said input/output port outputs read data.

6. A random access memory controller as recited in claim 5 wherein said second demultiplexer is wider than said first demultiplexer.

7. A random access memory controller as recited in claim 6 wherein said first demultiplexer comprises a 1:8 demultiplexer and said second demultiplexer comprises a 1:10 demultiplexer.

8. A random access memory controller as recited in claim 7 wherein said write data comprises 8-bits and said command data comprises 2-bits.

9. A random access memory controller as recited in claim 8 wherein said command data comprises a 1-bit address data and a 1-bit control data.

10. A random access memory controller as recited in claim 5 wherein said register is sized to store a page of write data.

11. A method for performing a simultaneous read and write operation for a random access memory, comprising steps of:

inputting command data to a command port for controlling said random access memory;

in a read mode, outputting read data from said random access memory to an input/output port;

in a write mode, inputting write data to be written to said random access memory to said input/output port; and in a simultaneous read and write mode, inputting multiplexed write data and command data to said command port and outputting said read data from said random access memory to said input/output port.

12. A method for performing a simultaneous read and write operation for a random access memory as recited in claim 11 further comprising the step of storing said write data in a buffer register.

13. A method for performing a simultaneous read and write operation for a random access memory as recited in claim 11 further comprising the step of:

demultiplexing said multiplexed write data and command data into write data, address data, and control data.

* * * * *